United States Patent
Kanakasabapathy

(10) Patent No.: US 7,642,147 B1
(45) Date of Patent: Jan. 5, 2010

(54) METHODS FOR REMOVING SIDEWALL SPACERS

(75) Inventor: Sivananda K. Kanakasabapathy, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/242,977

(22) Filed: Oct. 1, 2008

(51) Int. Cl.
*H01L 21/8238* (2006.01)
(52) U.S. Cl. ............... 438/199; 438/230; 257/E21.632
(58) Field of Classification Search ............... 438/199, 438/230; 257/E21.632
See application file for complete search history.

(56) References Cited

U.S. PATENT DOCUMENTS

| | | | |
|---|---|---|---|
| 5,895,955 A | 4/1999 | Gardner et al. | |
| 7,041,583 B2 | 5/2006 | Wieczorek et al. | |
| 2004/0087155 A1 | 5/2004 | Wieczorek et al. | |
| 2005/0233532 A1 | 10/2005 | Lenski et al. | |
| 2008/0164531 A1* | 7/2008 | Jawarani et al. | 257/369 |
| 2008/0217686 A1* | 9/2008 | Majumdar et al. | 257/347 |
| 2009/0186455 A1* | 7/2009 | Bedell et al. | 438/199 |

* cited by examiner

*Primary Examiner*—Jack Chen
(74) *Attorney, Agent, or Firm*—Schmeiser, Olsen & Watts; Louis J. Percello

(57) ABSTRACT

A method for removing sidewall spacers. The method includes: (a) forming a gate stack on a substrate; after (a), (b) forming dielectric spacers on sidewalls of the gate stack; after (b), (c) forming a dielectric sacrificial layer over the substrate and on the gate stack where the substrate and the gate stack are not covered by the spacers; and after (c), (d) removing the sacrificial layer and the spacers in a etch process by etching the sacrificial layer until the spacers are exposed and thereafter simultaneously etching the sacrificial layer and the spacers until the sacrificial layer and the spacers are removed. Methods for spacer removal from PFETs when a stress layer is formed over the NFETs are also disclosed.

7 Claims, 8 Drawing Sheets

US 7,642,147 B1

METHODS FOR REMOVING SIDEWALL SPACERS

FIELD OF THE INVENTION

The present invention relates to the field of semiconductor device fabrication; more specifically, it relates to method for removing sidewall spacers from gate stacks of field effect transistors.

BACKGROUND OF THE INVENTION

Sidewall spacers are used in the fabrication of complementary Metal Oxide (CMOS) transistors in order to self-align implantation source/drains and metal silicide contacts. By providing a bilaterally symmetric offset from the edge of the gate, through a sidewall spacer, one can achieve symmetric source and drain implant profiles. Also simultaneous metallization of the gate, source and drain while the extension region remains protected by the dielectric spacer. However, sidewall spacers do not serve any functional role after formation of the source/drains and metal silicide contacts and they are increasingly viewed as undesirable vestigial features that may adversely effect further fabrication. Accordingly, there exists a need in the art for a spacer removal process.

SUMMARY OF THE INVENTION

A first aspect of the present invention is a method, comprising: (a) forming a gate stack on a substrate; after (a), (b) forming dielectric spacers on sidewalls of the gate stack; after (b), (c) forming a dielectric sacrificial layer over the substrate and on the gate stack where the substrate and the gate stack are not covered by the spacers; and after (c), (d) removing the sacrificial layer and the spacers in a etch process by etching the sacrificial layer until the spacers are exposed and thereafter simultaneously etching the sacrificial layer and the spacers until the sacrificial layer and the spacers are removed.

A second aspect of the present invention is a method, comprising: (a) forming a first gate stack on a first region of a substrate and a second gate stack on second region of the substrate; after (a), (b) forming dielectric first spacers on sidewalls of the first gate stack and forming dielectric second spacers on sidewalls of the second gate stack; after (b), (c) forming a continuous conformal dielectric stress layer on the first and second spacers and on surfaces of the first and second gate stacks and over the substrate where the first and second gate stacks and the substrate are not covered by the first or second spacers; after (c), (d) forming a continuous conformal dielectric capping layer on the stress layer; after (d), (e) removing the capping layer from the stress layer in the second region; after (e), (f) forming a dielectric sacrificial layer on the capping layer and on the stress layer where the stress layer is not covered by the capping layer; and after (f), (g) removing the sacrificial layer, the stress layer from the second region and the second spacers in a etch process by etching the sacrificial layer until the stress layer is exposed in the second region, thereafter simultaneously etching the sacrificial layer and the stress layer in the second region until the second spacers are exposed and thereafter simultaneously etching the sacrificial layer, the stress layer in the second region and the second spacers until the sacrificial layer is removed, the stress layer is removed from the second region and the second spacers are removed.

A third aspect of the present invention is a method, comprising: (a) forming a first gate stack on a first region of a substrate and a second gate stack on second region of the substrate; after (a), (b) forming dielectric first spacers on sidewalls of the first gate stack and forming dielectric second spacers on sidewalls of the second gate stack; after (b), (c) forming a continuous conformal dielectric stress layer on the first and second spacers and on surfaces of the first and second gate stacks and over the substrate where the first and second gate stacks and the substrate are not covered by the first spacers or the second spacers; after (c), (d) forming a continuous conformal dielectric capping layer on the stress layer; after (d), (e) removing the capping layer and the stress layer in the second region; after (e), (f) forming a dielectric sacrificial layer on the capping layer and on the second spacers, the second gate stack where the second gate stack is not covered by the second spacers and over the substrate in the second region where the substrate is not covered by the second spacers or the second gate stack; and after (f), (g) removing the sacrificial layer and the second spacers in a etch process by etching the sacrificial layer until the second spacers are exposed and thereafter simultaneously etching the sacrificial layer and the second spacers until the sacrificial layer and the second spacers are removed.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1A:
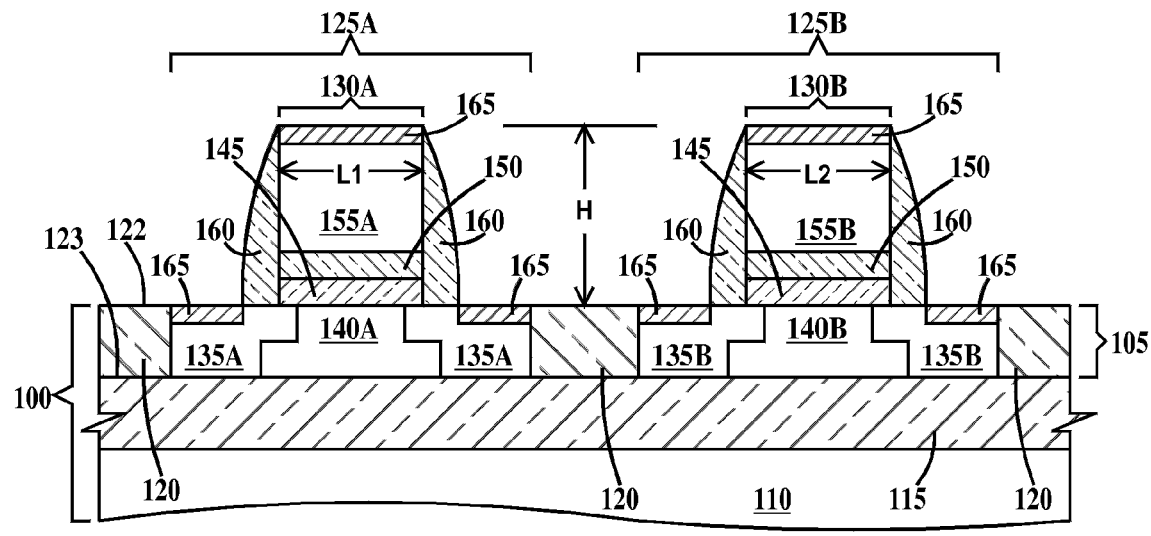
FIGS. 1A through 1D are cross-sections illustrating a first sidewall removal method according to embodiments of the present invention.

FIGS. 1A through 1D are cross-sections illustrating a first sidewall removal method according to embodiments of the present invention. In FIG. 1, a substrate 100 includes an upper single-crystal silicon layer 105 separated from a bulk silicon substrate 110 by a buried oxide (BOX) layer 115. Formed in silicon layer 105 is dielectric trench isolation 120, which extends from a top surface 122 of substrate 100 to a top surface 123 of BOX layer 115. In FIG. 1A, an n-channel field effect transistor (NFET) 125A and a p-channel field effect transistor (PFET) 125B are fabricated. NFET 125A includes a gate stack 130A formed above top surface 122 of substrate 100 and source/drains 135A separated by a channel region 140A formed in silicon layer 105. Gate stack 130A includes a gate dielectric layer 145, an optional refractory metal layer 150 and a polysilicon electrode 155A. Source/drains 135A are doped N-type and channel region 140A is doped P type. Polysilicon electrode 155A may be doped N type or may be undoped. PFET 125B includes a gate stack 130B formed above top surface 122 of substrate 100 and source/drains 135B separated by a channel region 140B formed in silicon layer 105. Gate stack 130B includes gate dielectric layer 145, optional refractory metal layer 150 and a polysilicon electrode 155B. Source/drains 135B are doped P-type and channel region 140B is doped N type. Polysilicon electrode 155B may be doped P type or may be undoped. Dielectric sidewall spacers 160 are formed on opposite sidewall of gate stack 130A and on opposite sidewalls of gate stack 130B. Metal silicide contacts 165 are formed in source/drains 135A and 135B and on surfaces of polysilicon layers 155A and 155B not covered by sidewall spacers 160.

The process sequence for fabricating NFET 125A and PFET 125B comprises: (1) forming trench isolation 120, (2) forming gate stacks 130A and 130B, (3) forming sidewall spacers 160, (4) forming source/drains 135A and forming source/drains 135B, and (5) forming silicide contacts 165. Trench isolation 120 is formed by etching trenches in silicon layer 105, the trenches extending down to BOX layer 115, depositing a dielectric material (e.g., TEOS oxide, an oxide deposited from tetraethoxysilane) to fill the trenches and then performing a planarizing process (e.g., a chemical-mechanical polish (CMP)) so top surfaces of silicon layer 105 and trench isolation 120 are coplanar. Gate stacks 130A and 130B are formed by depositing, in sequence, continuous layers of gate dielectric, optional refractory metal and polysilicon and then photolithographically patterning the stacked layers into separate gate stacks. Spacers 160 are formed by conformally depositing a material (e.g., silicon nitride) to conformally coat exposed surface of substrate 100 and gate stacks 130A and 130B, followed by a reactive ion etch (RIE) to remove the spacer material from horizontal surfaces (except under the spacer itself) of the substrate and gate stacks. Source/drains 135A and 135B are formed by separate ion implantations, PFET 125B being protected from source/drain 135A ion implantation by a photolithographically formed blocking mask and NFET 125B being protected from source/drain 135B ion implantation by a different photolithographically formed blocking mask. Silicide contacts 165 are formed by depositing a metal layer on exposed surfaces of substrate 100 and gate stacks 130A and 130B, heating to a temperature to cause reaction between the metal and any exposed silicon, and then removing unreacted metal.

Gate stack 130A has a height H and physical gate length L1. Gate stack 130B has a height H and physical gate length L2. Physical gate length (the perpendicular distance between source and drain on the surface of the silicon) should not be confused with electrical gate length, which is shorter and measured electrically. In one example, H is between about 120 nm and about 150 nm. In one example, L1 and L2 are independently between about 50 nm and about 100 nm. In one example, gate dielectric layer 145 comprises silicon dioxide. In one example, gate dielectric layer 145 comprises a high dielectric contact (high K) material. A high K material has a relative permittivity above about 10. In one example, gate dielectric layer 145 comprises a material selected from the group consisting of $HfO_2$, HfSiO, HfSiON, $ZrO_2$, ZrSiO, ZrSiO, ZrSiON, GdO, GdSiO, GdSiON, $ScO_2$, $ScSiO_2$, ScSiON and combinations thereof. In one example, refractory metal layer 150 includes a material selected from the group consisting of Ti, TiN, TiSiN, TiSi, Ta, TaN, TaSi, TaSiN, W, WN and combinations thereof. In one example, the thickness of sidewall spacers 160 is about 50 nm proximate to top surface 122 of substrate 100 and gradually thins to about 3 nm proximate to silicide layer 165 on top of polysilicon electrode 155A or 155B. As mentioned supra, in one example, spacers 160 comprise silicon nitride. In one example, metal silicide contacts 165 comprise a metal silicide of a metal selected from the group consisting of Ni, Ni—Pt, Co, Er and Yb.

Substrate 100 is an example of a silicon-on insulator (SOI) substrate. The invention is equally applicable to other types of substrates such as bulk silicon substrates, where silicon layer 105 and BOX layer 115 are not present and trench isolation, source drains 135A and 135B and channel regions 1540A and 140B are formed directly in substrate 110. In this example, NFET 125A would be fabricated in a P-well formed in the substrate 110 and PFET 125B would be formed in an N-well formed in substrate 110, and trench isolation 120 would separate upper regions of adjacent N-wells and P-wells.

Figure 1B:
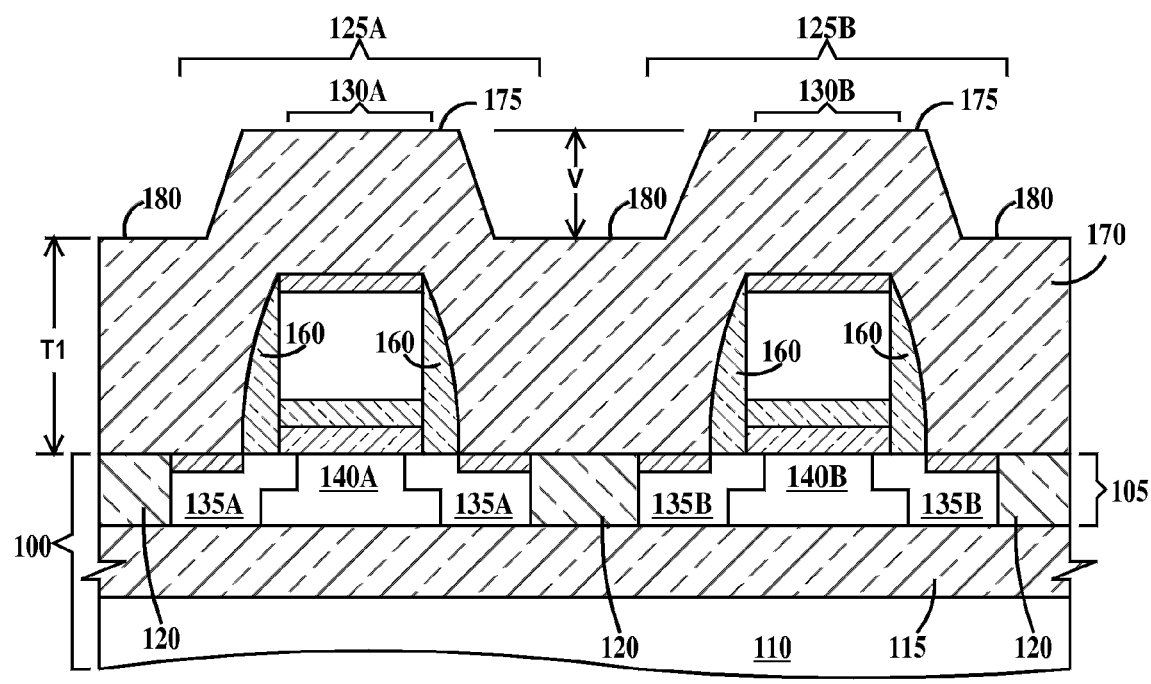

In FIG. 1B, a sacrificial layer 170 is formed over gate stacks 130A and 130B and by regions of substrate 100 not covered by gate stacks 130A and 130B. Depending upon the material and method of forming sacrificial layer 170, a top surface topology of layer 170 may include raised plateaus 175 extending above depressions 180. The thickness T1 of sacrificial layer 170 in depressions 180 is greater than the height H (see FIG. 1A) of gate stacks 130A and 130B. In one example, T1 is equal to between about 1.25 times H to about 4 times H. Sacrificial layer 170 comprise a material having an RIE rate similar to that of sidewall spacers 160 in a same RIE etch process (e.g., same gases, gas flow rates, pressure, RF power and DC bias, if any). In one example, the etch rate of sacrificial layer 170 is between about 90% and about 110% of that of the material of spacers 160. In one example, sacrificial layer 170 comprises silicon nitride. In one example, sacrificial layer 170 comprises a material having a same chemical composition as that of spacers 160. One method of forming sacrificial layer 170 with the topology illustrated in FIG. 1B is by chemical vapor deposition (CVD). One method of forming sacrificial layer 170 is by spin application of material that is self-leveling. If the difference in thickness V between the thinnest regions and thickest regions of sacrificial layer 170 is less than about 10% of T1 then the step illustrated in FIG. 1C and described infra may be slipped and the method proceeds to the step, illustrated in FIG. 1D and described infra.

Figure 1C:
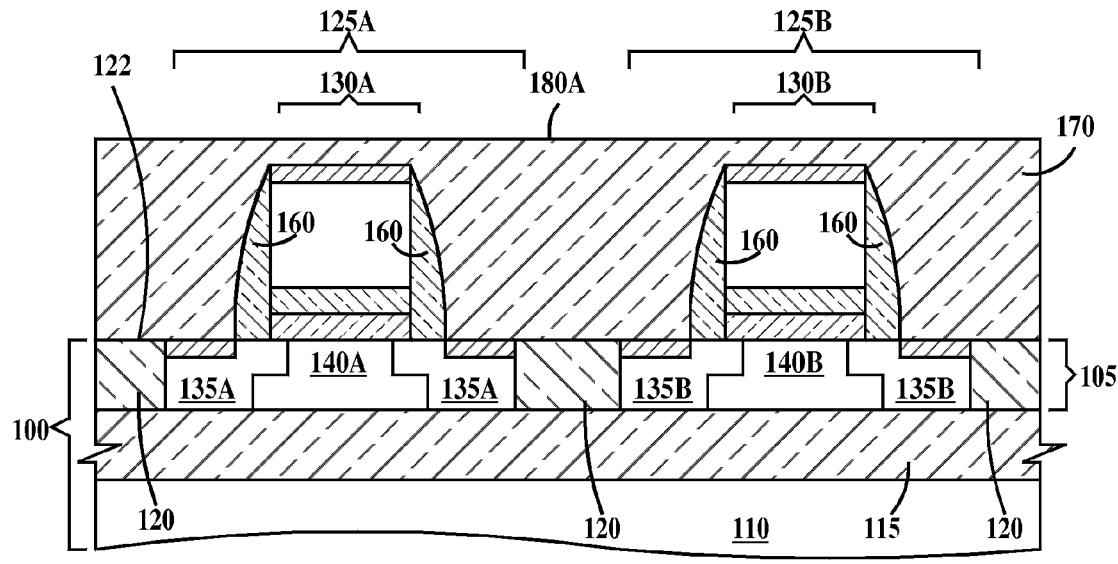
Figure 1D:
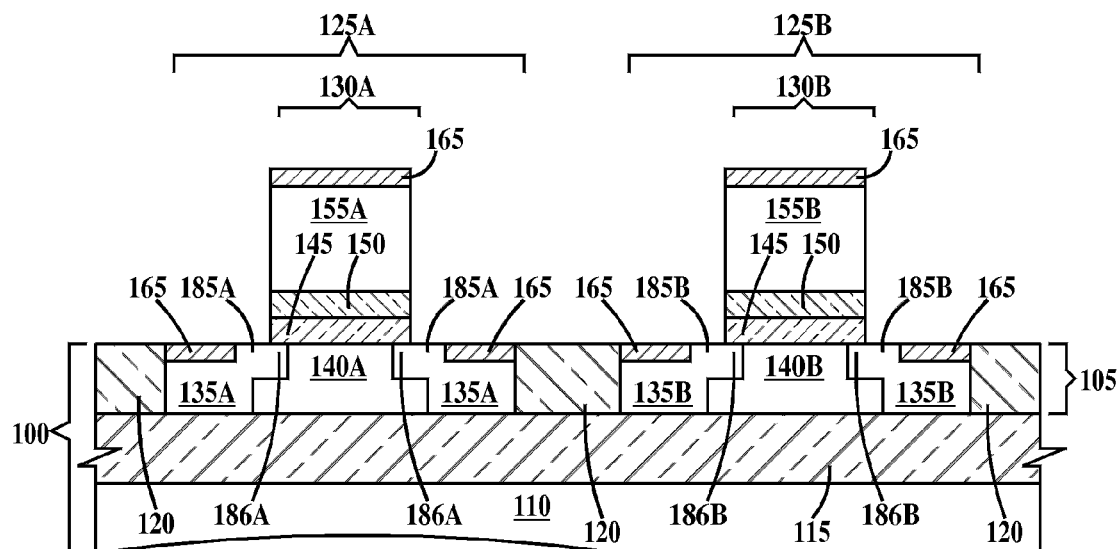
Figure 1E:
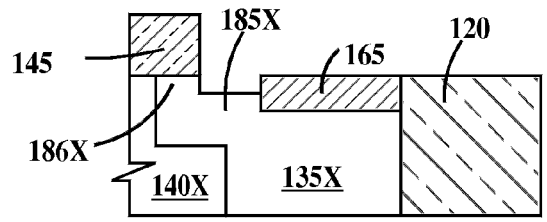
FIG. 1E is a blow-up of a region of FIG. 1D.

In FIG. 1C, a CMP has been performed so a top surface 180A of sacrificial layer 170 is planar and parallel to top surface 100 of substrate 100. In FIG. 1D, an RIE etch selective to metal silicide layer 165, silicon (source/drain regions 135A and 135B) and trench isolation 120 (i.e., etches sacrificial layer 170 and spacers 160 faster than metal silicide layer 165, silicon and trench isolation 120) has been performed to remove sacrificial layer 170 and sidewall spacers 160 (see FIG. 1C). Note, after removal of sacrificial layer 170 and spacers 160, regions 185A of source/drains 135A remain coplanar with regions 186A of source/drains 135A under gate stack 130A and regions 185B of source/drains 135B remain coplanar with regions 186B of source/drains 135B under gate stack 130B. Alternatively, after removal of sacrificial layer 170 and spacers 160, surface s of regions 185A of source/drains 135A between gate stack 130A and silicide contacts 165 are recessed no more than about 1 nm below surfaces of regions 186A of source/drains 135A under gate stack 130A and surfaces of regions 186B of source/drains 185B between gate stack 130B and silicide contacts 165 are recessed no more than about 1 nm below surfaces of regions 186B of source/drains 135B under gate stack 130B as shown in FIGS. 1D and 1E where X represents A or B. Removal of sacrificial layer 170 and spacers 160 (see FIGS. 1B and 1C) has been accomplished with no photolithographic masking steps after the formation of the sacrificial layer.

Figure 2A:
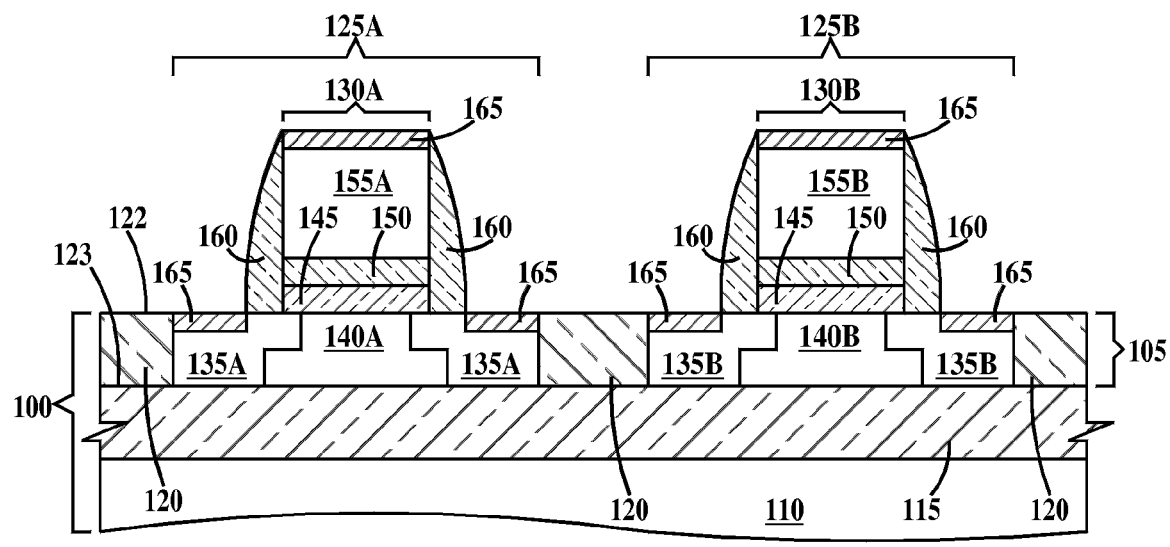
FIGS. 2A through 2F are cross-sections illustrating a second sidewall removal method according to embodiments of the present invention.
Figure 2B:
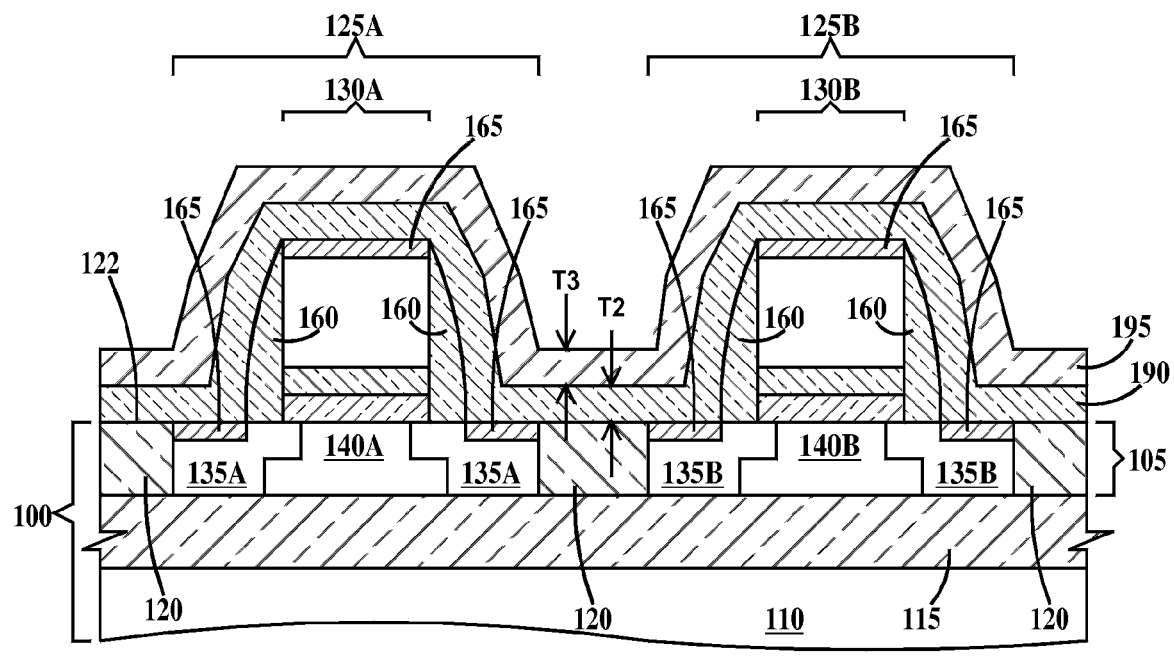

FIGS. 2A through 2F are cross-sections illustrating a second sidewall removal method according to embodiments of the present invention. FIG. 2A is similar to FIG. 1A. In FIG. 2B, a conformal stress layer 190 is formed on silicide layers 165, spacers 160 and regions of top surface 122 of substrate 100 not covered by gate stacks 130A and 130B and spacers 160. Formed on stress layer 190 is a conformal capping layer 195. In one example, stress layer 190 comprises silicon nitride under internal tensile stress. Note if spacers 160 comprise silicon nitride, the spacers and stress layer 190 will have a same chemical composition and different internal stress levels, with no stress or nearly no stress preferred for the spacers. In one example, the etch rate of stress layer 190 is between about 90% and about 110% of that of the material of spacers 160. The tensile stress of the stress layer 190 is transferred to the single-crystal silicon portions (i.e., source/drains 135A and channel region 140A) of NFET 125A where the mobility of the majority carriers (i.e., electrons) is enhanced compared to the mobility in unstressed silicon. In one example, capping layer 195 comprises a low-temperature oxide (LTO). LTO is an oxide formed by plasma enhanced chemical vapor deposition (PECVD) from silane and oxygen at a substrate temperature of about 500° C. or less. Stress layer 190 has a thickness of T2 and capping layer 195 has a thickness T3. In one example, T2 is no greater than about 1000 nm. In one example, T3 is between about 100 nm and about 400 nm.

Figure 2C:
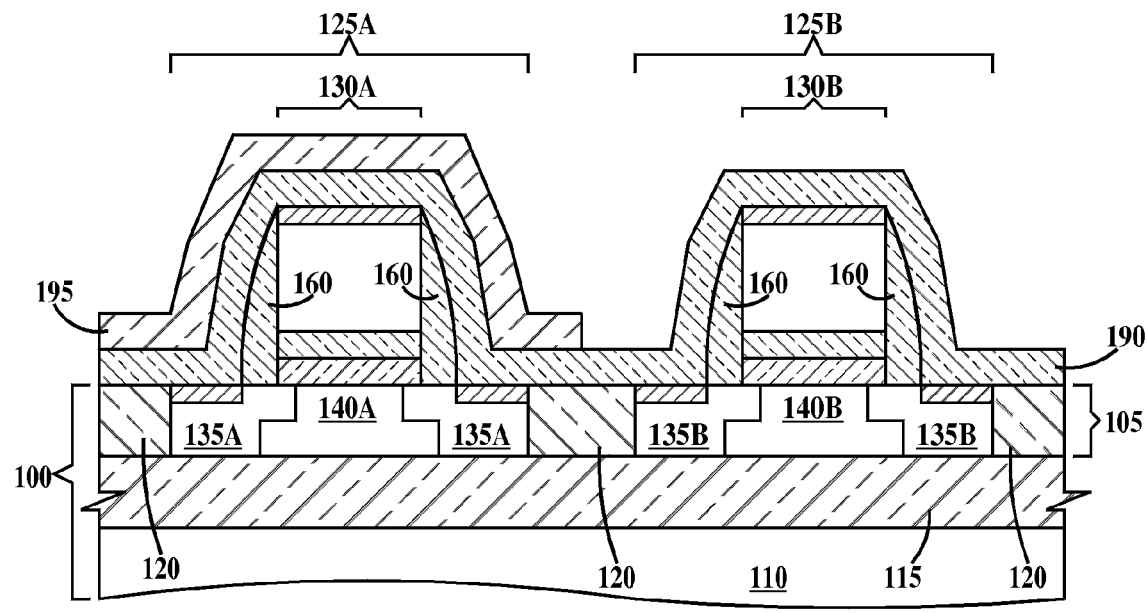

In FIG. 2C, capping layer 195 is removed from over PFET 125B but not from over NFET 125A. Removal of capping layer 195 may be performed by photolithographically forming a photoresist mask over NFET 125A, RIE etching the exposed capping layer 195 selective to stress layer 190 (i.e., etches capping layer 195 faster than stress layer 190) and removing the photoresist mask.

Figure 2D:
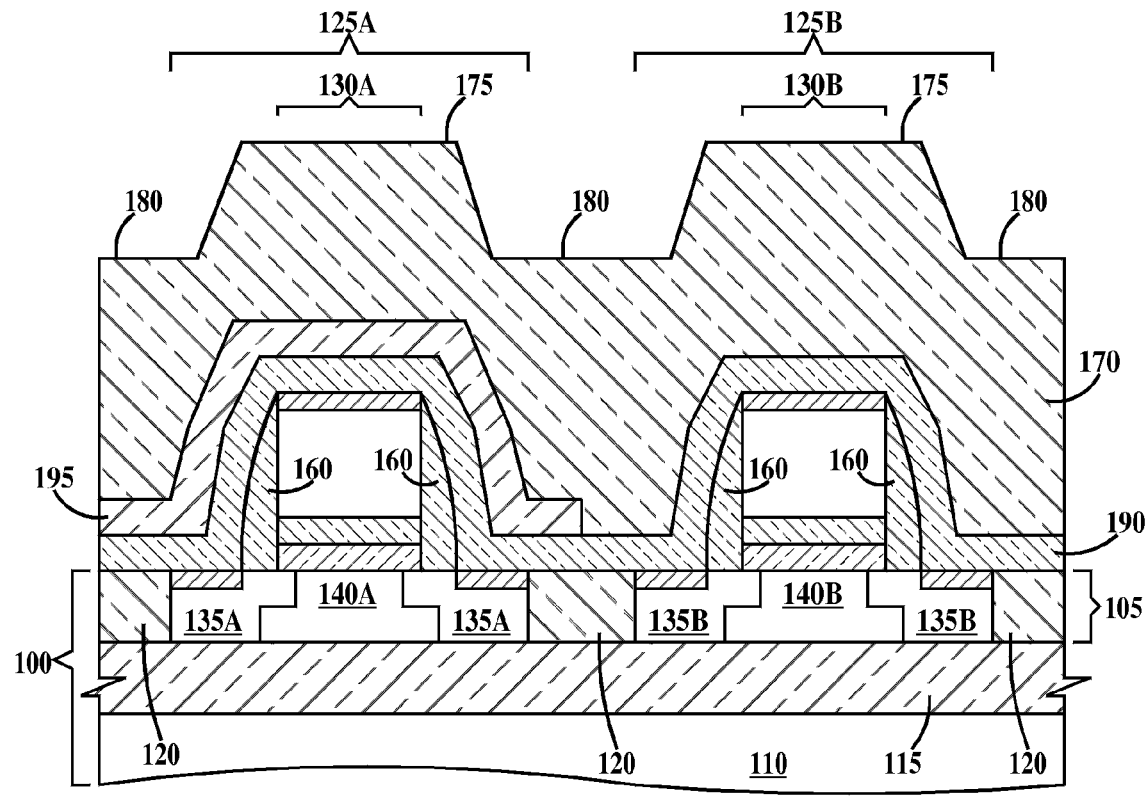
Figure 2E:
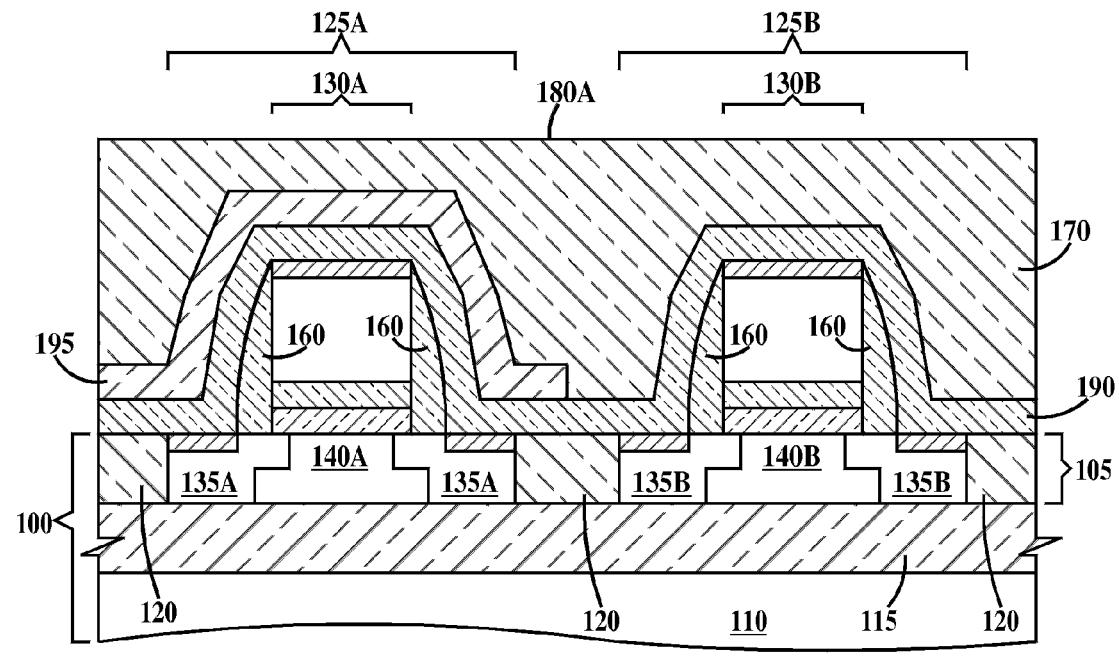

In FIG. 2D, sacrificial layer 170 is formed on capping layer 195 and stress layer 190 where the stress layer is not covered by the capping layer. Sacrificial layer 170 has been described supra. As described supra, dependent upon the topology of sacrificial layer 170, the step illustrated in FIG. 2E and described supra in reference to FIG. 1C may be performed or the method may proceed directly to the step illustrated in FIG. 2F. In FIG. 2E, a CMP is performed forming surface 180A. In one example, stress layer 190, sacrificial layer 170 and spacers 160 have a same chemical composition.

Figure 2F:
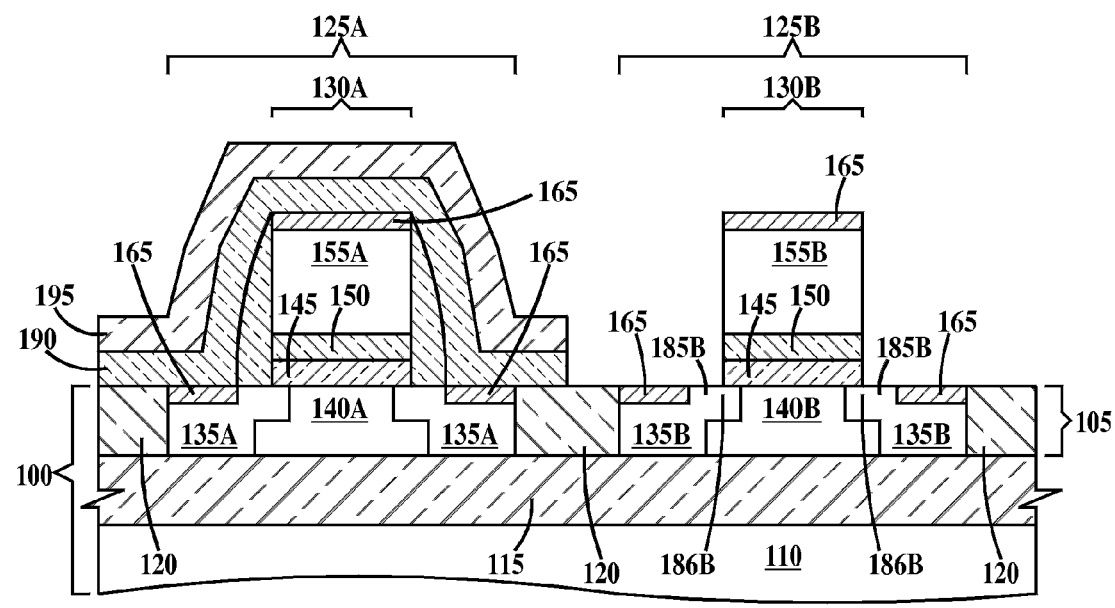

In FIG. 2F, an RIE etch selective to metal silicide layer 165, silicon, trench isolation 120 and capping layer 195 has been performed to remove sacrificial layer 170, stress layer 190 and sidewall spacers 160 of PFET 125B (see FIG. 2C). Note, after removal of sacrificial layer 170, stress layer 190 and spacers 160 from PFET 125B, regions 185B of source/drains 135B remain coplanar with regions 186B of source/drains 135B under gate stack 130B. Alternatively, after removal of sacrificial layer 170, stress layer 190 and spacers 160 from PFET 125B, regions 186B of source/drains 135B are depressed no more than about 1 nm below regions 185B of source/drains 135B under gate stack 130B as shown in FIG. 1E where X represents B for the second embodiment. Removal of sacrificial layer 170 (or 170A), stress layer 190 and spacers 160 (see FIGS. 2D and 2E) has been accomplished with no photolithographic masking steps after formation of the sacrificial layer.

Figure 3A:
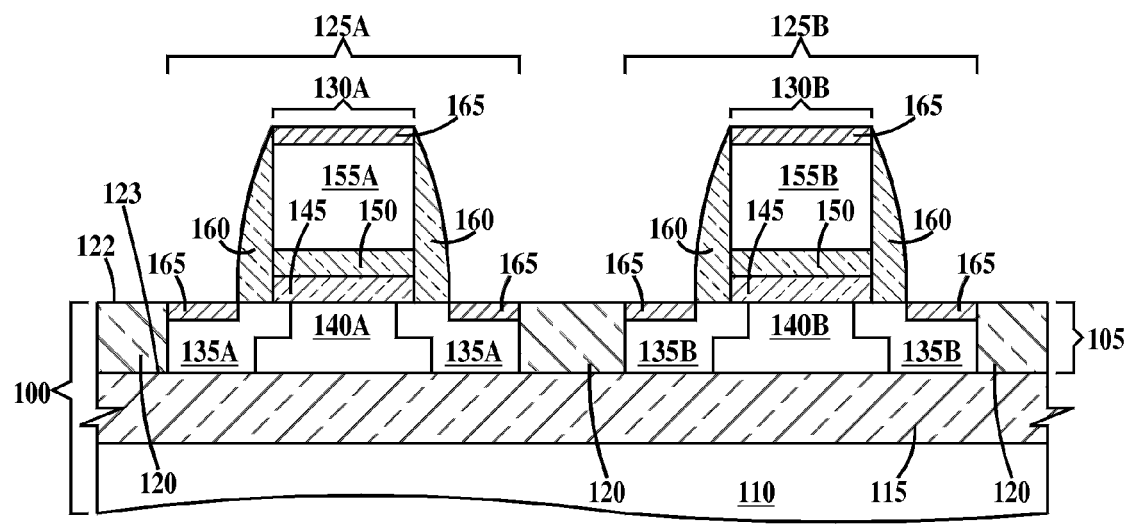
FIGS. 3A through 3F are cross-sections illustrating a third sidewall removal method according to embodiments of the present invention.
Figure 3B:
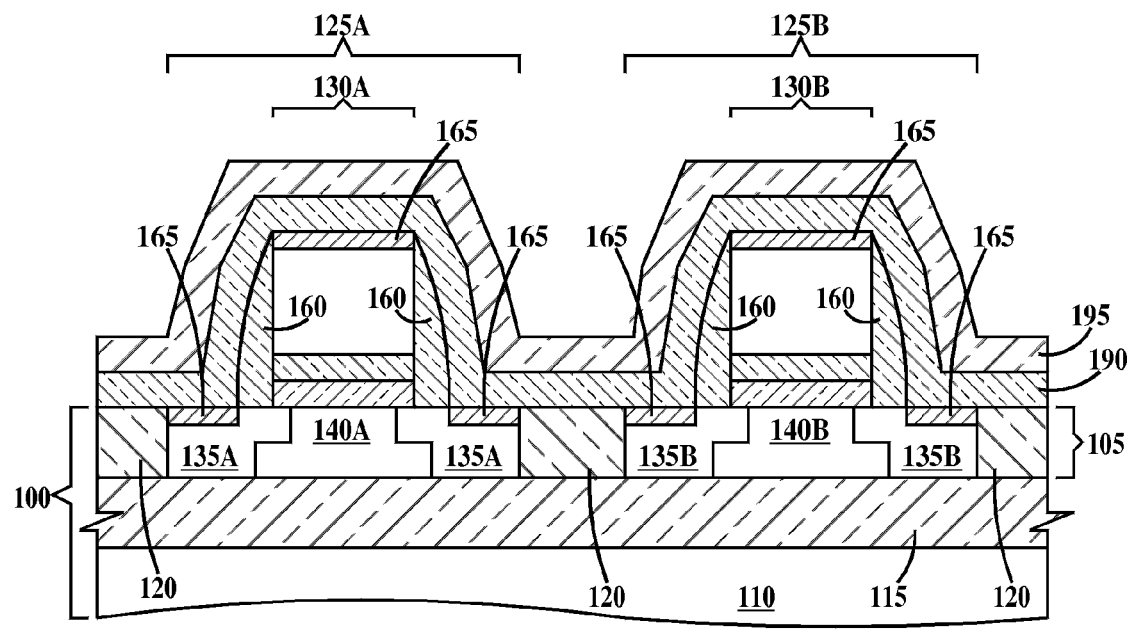
Figure 3C:
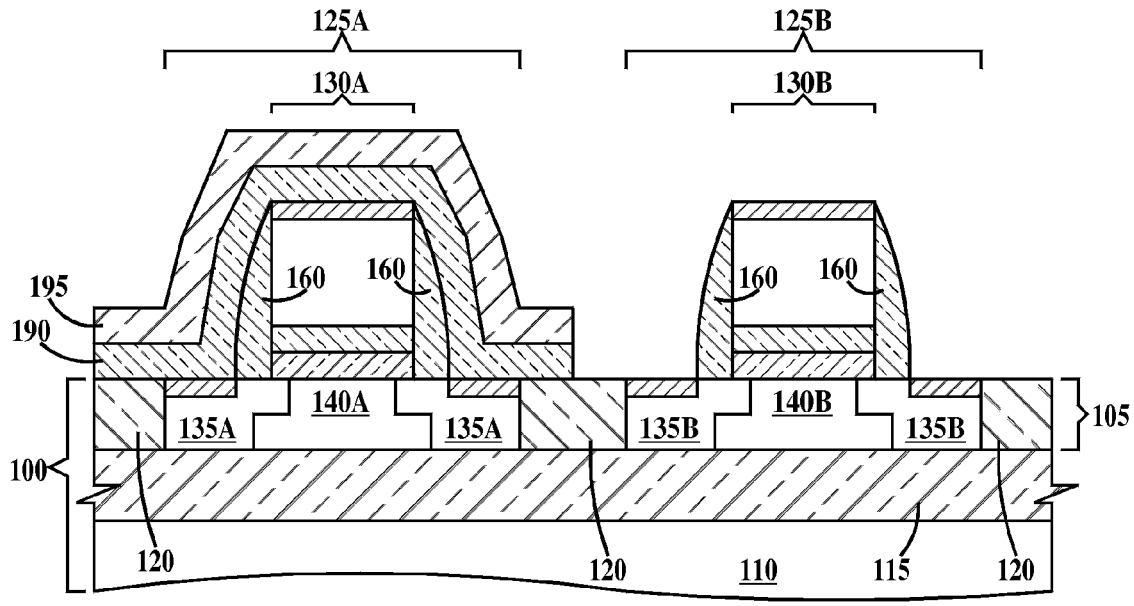

FIGS. 3A through 3F are cross-sections illustrating a third sidewall removal method according to embodiments of the present invention. FIG. 3A is similar to FIG. 2A and FIG. 3B is similar to FIG. 2B. In FIG. 3C, first capping layer 195 is removed from over PFET 125B but not from over NFET 125A. Next, stress layer 190 is removed from over PFET 125B but not from over NFET 125A. Removal of capping layer 195 may be performed by photolithographically forming a photoresist mask over NFET 125A, RIE etching the exposed capping layer 195 selective to stress layer 190 (i.e., etches capping layer 195 faster than stress layer 190) then RIE etching stress layer 190 selective to metal silicide layer 165, spacers 160 and trench isolation 120 and then removing the photoresist mask.

Figure 3D:
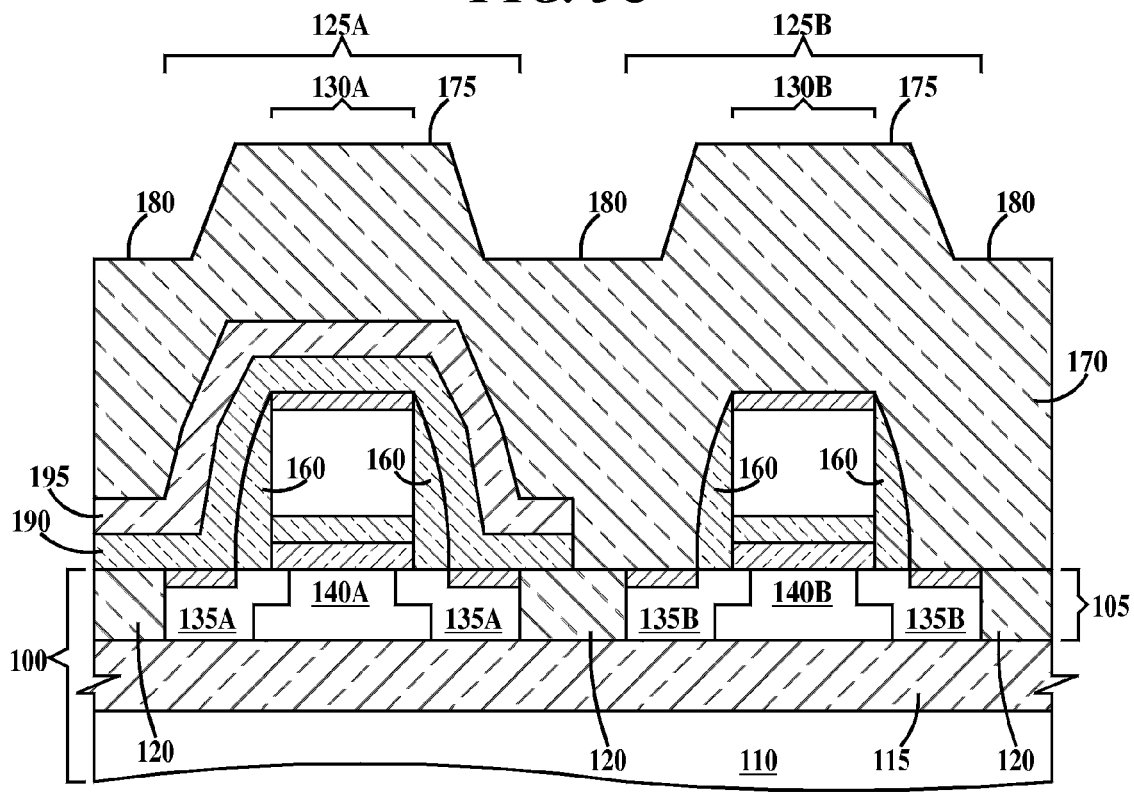
Figure 3E:
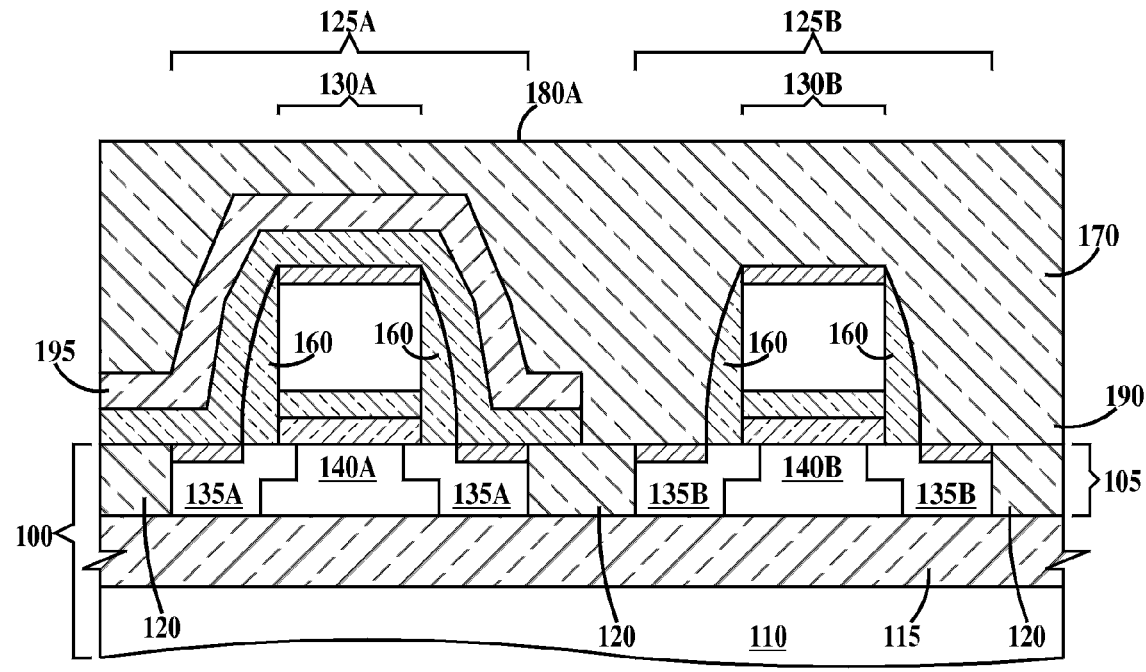

In FIG. 3D, sacrificial layer 170 is formed on capping layer 195 on silicide layers 165 and spacers 160 of PFET 125B and any trench isolation not covered by stress layer 190 and capping layer 195. Sacrificial layer 170 has been described supra. As described supra, dependent upon the topology of sacrificial layer 170, the step illustrated in FIG. 3E and described supra in reference to FIG. 1C may be performed or the method may proceed directly to the step illustrated in FIG. 3F. In FIG. 3E, a CMP is performed forming surface 180A.

Figure 3F:
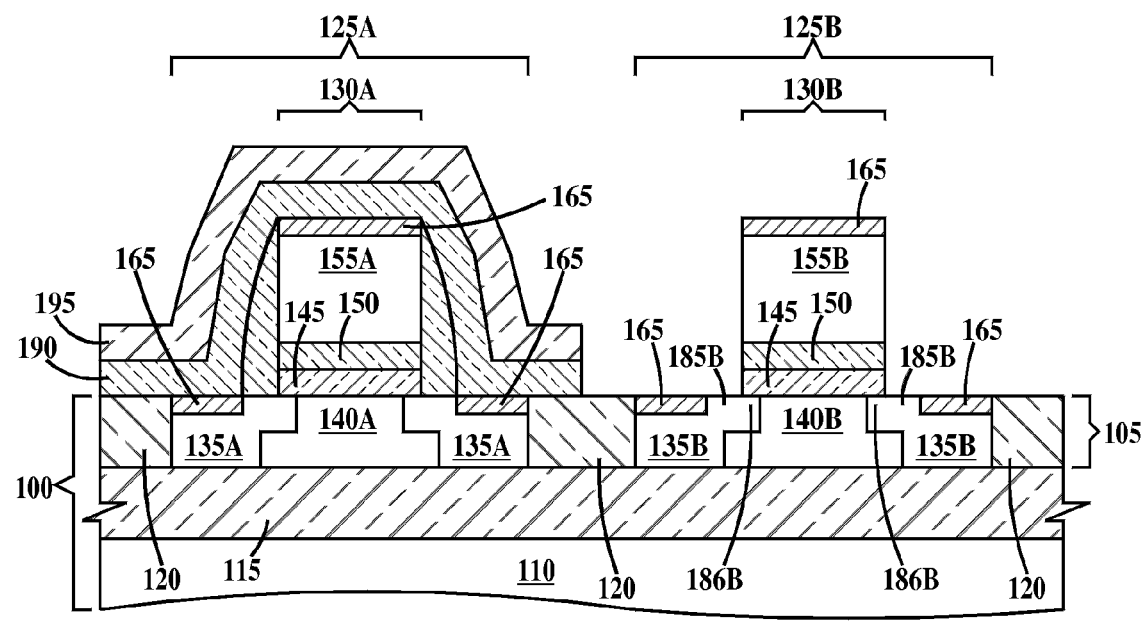

In FIG. 3F, an RIE etch selective to metal silicide layer 165, silicon, trench isolation 120 and capping layer 195 has been performed to remove sacrificial layer 170 and sidewall spacers 160 of PFET 125B (see FIG. 2C). Note, after removal of sacrificial layer 170 and spacers 160 from PFET 125B, regions 185B of source/drains 135B remain coplanar with regions 186B of source/drains 135B under gate stack 130B. Alternatively, after removal of sacrificial layer 170 and spacers 160 from PFET 125B, regions 186B of source/drains 135B are depressed no more than about 1 nm below regions 185B of source/drains 135B under gate stack 130B as shown in FIG. 1E where X represents B for the third embodiment. Removal of sacrificial layer 170 (or 170A), stress layer 190, capping layer 195 and spacers 160 (see FIGS. 3D and 3E) has been accomplished with no photolithographic masking steps after formation of the sacrificial layer.

Thus the embodiments of the present invention provide a method for removal of sidewall spacers with minimal to no damage to the underlying structures.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:
   (a) forming a first gate stack on a first region of a substrate and a second gate stack on second region of said substrate;
   after (a), (b) forming dielectric first spacers on sidewalls of said first gate stack and forming dielectric second spacers on sidewalls of said second gate stack;
   after (b), (c) forming a continuous conformal dielectric stress layer on said first and second spacers and on surfaces of said first and second gate stacks and over said substrate where said first and second gate stacks and said substrate are not covered by said first or second spacers;
   after (c), (d) forming a continuous conformal dielectric capping layer on said stress layer;
   after (d), (e) removing said capping layer from said stress layer in said second region;
   after (e), (f) forming a dielectric sacrificial layer on said capping layer and on said stress layer where said stress layer is not covered by said capping layer; and
   after (f), (g) removing said sacrificial layer, said stress layer from said second region and said second spacers in a etch process by etching said sacrificial layer until said stress layer is exposed in said second region, thereafter simultaneously etching said sacrificial layer and said stress layer in said second region until said second spacers are exposed and thereafter simultaneously etching said sacrificial layer, said stress layer in said second region and said second spacers until said sacrificial layer is removed, said stress layer is removed from said second region and said second spacers are removed.

2. The method of claim 1, wherein an etch rate of said sacrificial layer and an etch rate of said stress layer during said etching are each independently between about 90% and about 110% of that of said second spacers.

3. The method of claim 1, wherein said sacrificial layer and said first and second spacers comprise respective materials having a same chemical composition, said stress layer in internal tensile stress.

4. The method of claim 1, further including:
between (f) and (g), planarizing a top surface said sacrificial layer by performing a chemical-mechanical-polish of an exposed surface of said sacrificial layer.

5. The method of claim 1, further including between (b) and (c):
forming in said substrate, a first source and a first drain of an n-channel field effect transistor on opposite sidewalls of said first gate stack and a first channel in said substrate between said first source and said first drain under said first gate stack, said first gate stack comprising a first gate dielectric layer between said substrate and a first polysilicon gate electrode, said substrate comprising silicon;

forming in said substrate, a second source and a second drain of a p-channel field effect transistor on opposite sidewalls of said second gate stack and a second channel in said substrate between said second source and said second drain under said second gate stack, said second gate stack comprising a second gate dielectric layer between said substrate and a second polysilicon gate electrode; and forming a metal silicide layer on exposed silicon surfaces of said first and second sources, said first and second drains and said first and second polysilicon gate electrodes.

6. The method of claim 5, wherein, after (g), an exposed surface of said second source and an exposed surface of said second drain are either (i) coplanar with a top surface of said substrate under said second gate stack or (ii) recessed a distance no greater than about 1 nm below said top surface of said substrate under said second gate stack.

7. The method of claim 1, wherein said sacrificial layer, said stress layer and said first and second spacers comprise respective materials having a same chemical composition.

* * * * *